United States Patent
Yang et al.

(10) Patent No.: US 9,093,308 B2
(45) Date of Patent: *Jul. 28, 2015

(54) DOUBLE SEAL RING

(71) Applicant: TAIWAN SEMICONDUCTOR MANUFACTURING COMPANY, LTD., Hsinchu (TW)

(72) Inventors: Ming-Hui Yang, New Taipei (TW); Hsin Wei Chiu, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 29 days.

This patent is subject to a terminal disclaimer.

(21) Appl. No.: 13/962,262

(22) Filed: Aug. 8, 2013

(65) Prior Publication Data
US 2014/0035107 A1 Feb. 6, 2014

Related U.S. Application Data

(63) Continuation of application No. 13/562,776, filed on Jul. 31, 2012, now Pat. No. 8,530,997.

(51) Int. Cl.
| | |
|---|---|
| *H01L 23/52* | (2006.01) |
| *H01L 23/02* | (2006.01) |
| *H01L 23/10* | (2006.01) |
| *H01L 23/522* | (2006.01) |
| *H01L 23/58* | (2006.01) |
| *H01L 21/48* | (2006.01) |

(52) U.S. Cl.
CPC ............ *H01L 23/10* (2013.01); *H01L 21/4814* (2013.01); *H01L 23/5225* (2013.01); *H01L 23/58* (2013.01); *H01L 23/585* (2013.01); *H01L 2924/0002* (2013.01)

(58) Field of Classification Search
USPC ......... 257/503, 618, 620, 758, 774, 484, 127, 257/495; 438/618–687
See application file for complete search history.

(56) References Cited

U.S. PATENT DOCUMENTS

| | | | |
|---|---|---|---|
| 6,998,712 B2 | 2/2006 | Okada et al. | |
| 7,675,143 B2 | 3/2010 | Kadoyama et al. | |
| 8,106,514 B2 * | 1/2012 | Nakashiba | 257/758 |
| 8,330,254 B2 | 12/2012 | Furumiya et al. | |
| 8,618,618 B2 * | 12/2013 | Tsutsue et al. | 257/409 |
| 2004/0150070 A1 | 8/2004 | Okada et al. | |
| 2006/0076651 A1 * | 4/2006 | Tsutsue | 257/620 |
| 2006/0102980 A1 * | 5/2006 | Nakashiba | 257/508 |
| 2008/0251923 A1 | 10/2008 | Wang et al. | |
| 2009/0250783 A1 * | 10/2009 | Nakashiba | 257/508 |
| 2009/0294929 A1 | 12/2009 | Lee et al. | |

(Continued)

*Primary Examiner* — Vongsavanh Sengdara
*Assistant Examiner* — Thai T Vuong
(74) *Attorney, Agent, or Firm* — Lowe Hauptman & Ham, LLP

(57) ABSTRACT

A double seal ring for an integrated circuit, the double seal ring includes a first seal ring surrounding the integrated circuit and a second seal ring spaced from the first seal ring. The double seal ring further includes two connectors connecting the first seal ring and the second seal ring, wherein the first seal ring, the second seal ring, and the two connectors form a closed loop. A method of forming a double seal ring for an integrated circuit includes forming a first seal ring surrounding the integrated circuit and forming a second seal ring spaced from the first seal ring. The method further includes forming two connectors connecting the first seal ring and the second seal ring, wherein the first seal ring, the second seal ring, and the two connectors form a closed loop.

20 Claims, 3 Drawing Sheets

(56) References Cited

U.S. PATENT DOCUMENTS

| | | |
|---|---|---|
| 2010/0084751 A1* | 4/2010 | Frederick et al. ............. 257/678 |
| 2010/0171203 A1* | 7/2010 | Chen et al. .................... 257/686 |
| 2010/0295146 A1 | 11/2010 | Lee et al. |
| 2010/0314720 A1* | 12/2010 | Tsutsue ........................ 257/618 |
| 2011/0108945 A1* | 5/2011 | Wang et al. ................... 257/508 |
| 2011/0260260 A1* | 10/2011 | Nakashiba .................... 257/369 |
| 2012/0305916 A1 | 12/2012 | Liu et al. |

* cited by examiner

DOUBLE SEAL RING

PRIORITY CLAIM

The present application is a continuation of U.S. application Ser. No. 13/562,776, filed Jul. 31, 2012, the disclosure of which is incorporated herein by reference in its entirety.

TECHNICAL FIELD

The present disclosure relates generally to an integrated circuit and more particularly a double seal ring.

BACKGROUND

Seal rings in integrated circuits are used to protect integrated circuits during a dicing (die sawing) process by preventing cracks. Seal rings can also serve as a barrier to moisture. However, seal rings can couple noise from external radio frequency signals or internal noise source into the integrated circuit inside via the metal path of the seal rings and impact device performance significantly. Seal rings may provide a noise path on which the noise can travel from noisy area of the circuit to other areas. Also, there is a mutual inductance issue arising from induced current along the seal rings that contributes to the noise.

For broken seal rings, moisture can penetrate through the broken spaces causing reliability issues such as early break down. The broken seal rings may not be suitable for extra low-k devices.

BRIEF DESCRIPTION OF THE DRAWINGS

Reference is now made to the following descriptions taken in conjunction with the accompanying drawings, in which.

DETAILED DESCRIPTION

Figure 1:
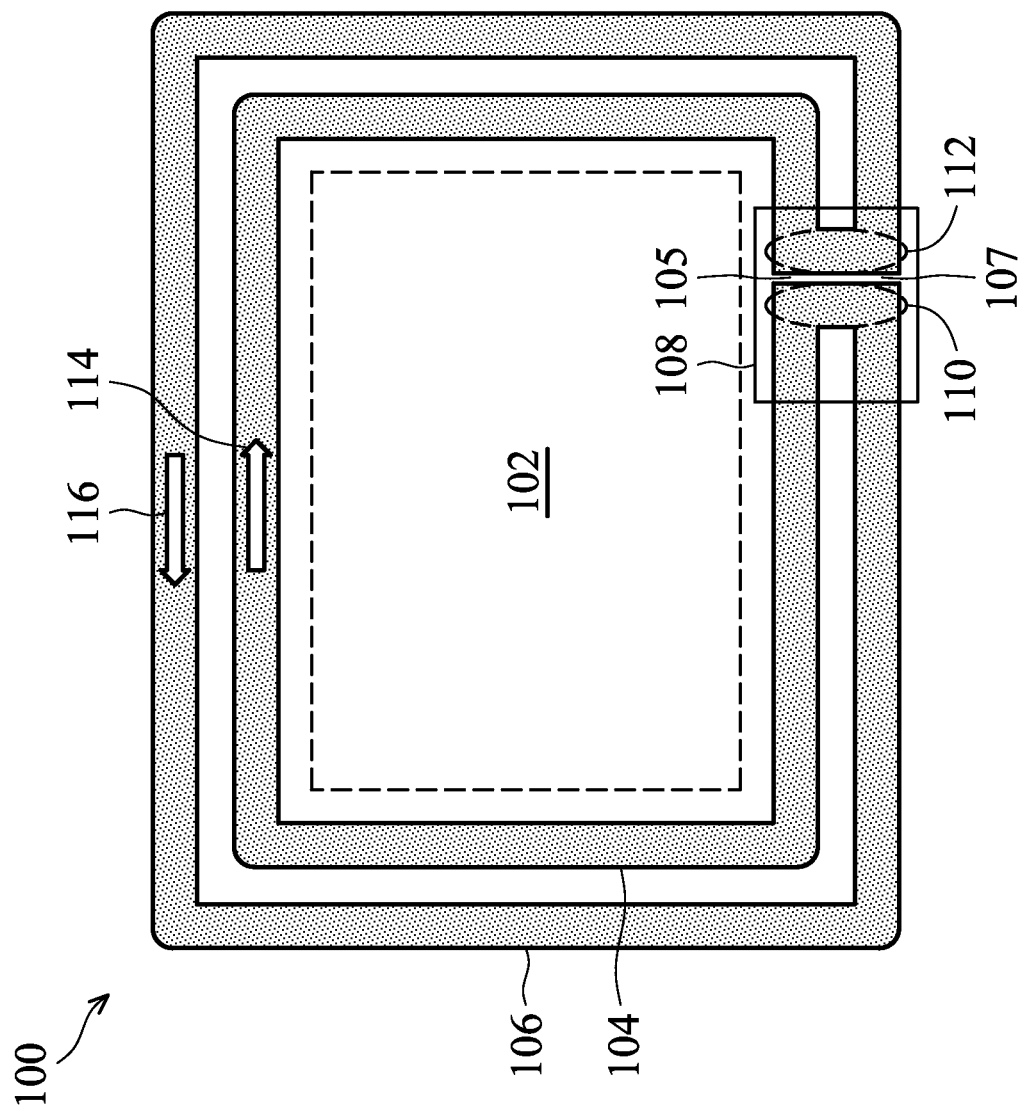
FIG. 1 is a schematic diagram of a double seal ring for an integrated circuit according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary double seal ring 100 for an integrated circuit 102 according to some embodiments. A double seal ring 100 for the integrated circuit 102 includes a first seal ring 104 with a first opening 105. The first seal ring 104 surrounds the integrated circuit 102. A second seal ring 106 has a second opening 107 and the second seal ring 106 surrounds the first seal ring 104. The first opening 105 and the second opening 107 are aligned and connect with the first seal ring 104 and the second seal ring 106 at a 90° angle in some embodiments.

Two connectors 110 and 112 connect the first opening 105 of the first seal ring 104 and the second opening 107 of the second seal ring 106. The first seal ring 104, the second seal ring 106, and the two connectors 110 and 112 form a closed loop. In some embodiments, the connectors 110 and 112 are curved lines such as arcs or any other shapes. In some other embodiments where the first opening 105 and the second opening 107 are not aligned, the two connectors 110 and 112 may have different shapes or angles other than straight lines connecting with the first seal ring 104 and the second seal ring 106 at a 90° angle.

Figure 2:
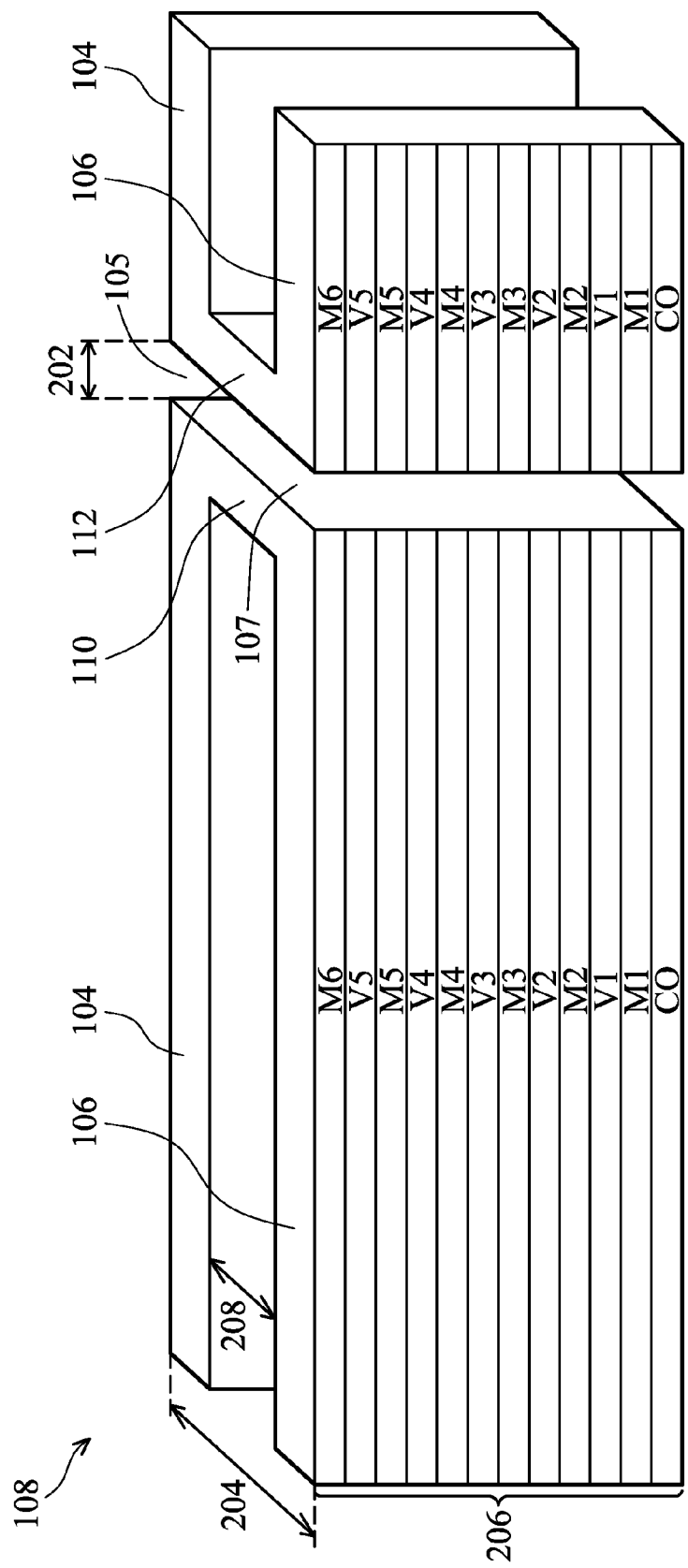
FIG. 2 is a detailed schematic diagram of a portion of the exemplary double seal ring in FIG. 1 according to some embodiments.

The first seal ring 104, the second seal ring 106, and the two connectors 110 and 112 comprise electrically conductive material. In some embodiments, the first seal ring 104, the second seal ring 106 and the two connectors 110 and 112 comprise metal, e.g., copper, aluminum, or any other suitable material. In some embodiments, the first seal ring 104, the second seal ring 106, and the two connectors 110 and 112 comprise multiple layers 206 having metal layers and via layers as shown in FIG. 2. In some embodiments, a single metal layer can be used instead of multiple layers 206 when the integrated circuit 102 has a single metal layer instead of multiple layers 206.

The first seal ring 104 and the second seal ring 106 have rectangular shapes in FIG. 1. In some embodiments, the first seal ring 104 and the second seal ring 106 have round corners. In some other embodiments, the first seal ring 104 and the second seal ring 106 have other shapes, such as octagonal shapes. In some embodiments, the first seal ring 104 and the second seal ring 106 having other shapes have round corners.

The double seal ring 100 formed in a closed loop induces a reverse current for any current resulting from noise to reduce mutual inductance. For example, if a first current 114 is induced on the first seal ring 104 from radio frequency noise or another source of noise, a second current 116 in the opposite direction (reverse current) is induced in the second seal ring 106. The reverse current is induced because the first seal ring 104 and the second seal ring 106 form a closed loop with the two connectors 110 and 112. The mutual inductance from the opposite currents 114 and 116 is reduced or eliminated because of the opposite direction of induced magnetic fields from the currents 114 and 116. Therefore, the influence of radio frequency noise or another noise source is reduced or eliminated on the integrated circuit 102.

The double seal ring 100 also prevents moisture penetration better than conventional broken seal ring and improves reliability. The double seal ring 100 can be used for all devices, including extra low-k devices. In some embodiments, any part of the double seal ring 100 can be grounded to further reduce noise coupling for the integrated circuit 102.

FIG. 2 is a more detailed diagram of a portion 108 of the exemplary double seal ring 100 in FIG. 1 according to some embodiments. The distance 202 between the two connectors 110 and 112 ranges from 10 μm to 20 μm in some embodiments. In some other embodiments, the distance 202 is kept as small as possible (e.g., 1 μm-5 μm), to prevent moisture penetration through the openings 105 and 107, and to reduce mutual inductance. The first seal ring 104 and the second seal ring 106 have a total width 204 ranging from 10 μm to 70 μm in some embodiments. In one example, the total width 204 is 20 μm. The distance 208 between first seal ring 104 and the second seal ring 106 ranges from 10 μm to 50 μm in some embodiments. In some other embodiments, the distance 208 is kept as small as possible (e.g., 1 μm-5 μm), to reduce mutual inductance.

In one example, when the distance 208 is 50 μm, mutual inductance coupling of an integrated circuit with the double seal ring 100 in FIG. 1 was reduced 27% at 5 gigahertz (GHz) noise frequency compared to an integrated circuit with a conventional seal ring. When the distance 208 is 10 μm, the mutual inductance coupling of the integrated circuit with the double seal ring 100 in FIG. 1 was reduced 40% at 5 GHz noise frequency compared to an integrated circuit with the conventional seal ring.

The first seal ring 104, the second seal ring 106, and the two connectors 110 and 112 comprise electrically conductive material. In some embodiments, the first seal ring 104, the second seal ring 106, and the two connectors 110 and 112 comprise metal, e.g., copper, aluminum, or any other suitable material. In some embodiments, the first seal ring 104, the second seal ring 106, and the two connectors 110 and 112 comprise multiple layers 206, e.g., a contact layer, metal layers and via layers formed during back-end processes.

In FIG. 2, the multiple layers 206 include a contact layer CO, a first metal layer M1, a first via layer V1, a second metal layer M2, a second via layer V2, a third metal layer M3, a third via layer V3, a fourth metal layer M4, a fourth via layer V4, a fifth metal layer M5, a fifth via layer V5, and a sixth metal layer M6. The multiple layers 206 of the dual seal ring 100 in FIG. 1 are formed simultaneously as the integrated circuit 102 inside are formed for contact layer, metal layers and via layers in some embodiments. In other words, the layers of the first seal ring 104 and the second seal ring 106 are formed simultaneously. Therefore, the fabrication of the double seal ring 100 does not need extra mask, process, or additional cost.

The contact layer, metal layers and via layers of the multiple layers 206 can comprise any suitable material and are formed or fabricated using any suitable methods or processes known in the art. For example, the contact layer and metal layers comprise Al, Cu, Sn, Ni, Au, Ag, or other suitable material, and can be deposited using electroplating, physical vapor deposition (PVD), sputtering, or any other suitable process and defined by etching. The via layers comprise Cu, Cu alloy, W, Au, Al, or any other suitable material in some embodiments. The via layers can be formed by PVD, chemical vapor deposition (CVD), and chemical-mechanical planarization (CMP), for example.

Figure 3:
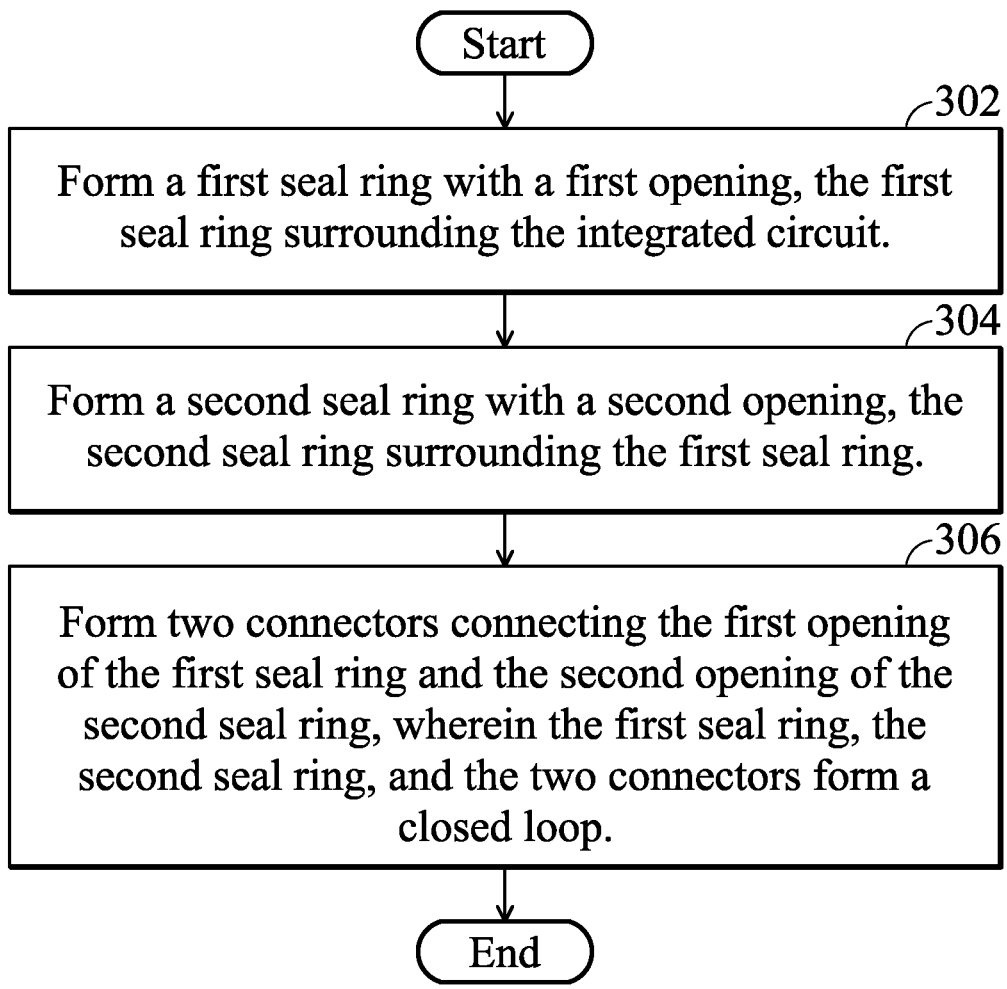
FIG. 3 is a flowchart for a method of forming a double seal ring for an integrated circuit.

FIG. 3 is a flowchart for a method of forming a double seal ring for an integrated circuit. At step 302, a first seal ring with a first opening is formed surrounding an integrated circuit. At step 304, a second seal ring with a second opening is formed surrounding the first seal ring. At step 306, two connectors are formed connecting the first opening of the first seal ring and the second opening of the second seal ring. The first seal ring, the second seal ring, and the two connectors form a closed loop. Even though the flowchart is shown with multiple steps in an order, the steps can be implemented with different orders or simultaneously with each other. For example, a metal layer can be deposited for the first seal ring, the second seal ring, and the two connectors simultaneously.

In various embodiments, the first seal ring, the second seal ring, and the two connectors comprise electrically conductive material or metal such as copper or aluminum. In some embodiments, the first seal ring, the second seal ring, and the two connectors comprise multiple layers, e.g., metal layers and via layers. The metal layers and via layers can comprise any suitable material and be formed or fabricated using any suitable methods or processes known in the art. For example, the metal layers comprise Al, Cu, Sn, Ni, Au, Ag, or other suitable material, and can be deposited using electroplating, physical vapor deposition (PVD), sputtering, or any other suitable process and defined by etching. The via layers comprise Cu, Cu alloy, W, Au, Al, or any other suitable material in some embodiments. The via layers can be formed by PVD, chemical vapor deposition (CVD), and chemical-mechanical planarization (CMP), for example.

The first seal ring and the second seal ring have rectangular shapes in some embodiments and can have round or curved corners. The first seal ring and the second seal ring have octagonal shapes in some embodiments and can have round or curved corners.

According to some embodiments, a double seal ring for an integrated circuit includes a first seal ring with a first opening. The first seal ring surrounds the integrated circuit. A second seal ring with a second opening surrounds the first seal ring. Two connectors connect the first opening of the first seal ring and the second opening of the second seal ring. The first seal ring, the second seal ring, and the two connectors form a closed loop.

According to some embodiments, a method of forming a double seal ring for an integrated circuit includes forming a first seal ring with a first opening, the first seal ring surrounding the integrated circuit. A second seal ring with a second opening is formed surrounding the first seal ring. Two connectors are formed connecting the first opening of the first seal ring and the second opening of the second seal ring. The first seal ring, the second seal ring, and the two connectors form a closed loop.

One aspect of this description relates to a double seal ring for an integrated circuit. The double seal ring includes a first seal ring surrounding the integrated circuit and a second seal ring spaced from the first seal ring. The double seal ring further includes two connectors connecting the first seal ring and the second seal ring, wherein the first seal ring, the second seal ring, and the two connectors form a closed loop.

Another aspect of this description relates to a method of forming a double seal ring for an integrated circuit. The method includes forming a first seal ring surrounding the integrated circuit and forming a second seal ring spaced from the first seal ring. The method further includes forming two connectors connecting the first seal ring and the second seal ring, wherein the first seal ring, the second seal ring, and the two connectors form a closed loop.

Still another aspect of this description relates to an integrated circuit with a double seal ring. The double seal ring includes a first seal ring surrounding the integrated circuit and a second seal ring spaced from the first seal ring. The double seal ring further includes two connectors connecting the first seal ring and the second seal ring, wherein the first seal ring, the second seal ring, and the two connectors form a closed loop and comprise electrically conductive material.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A double seal ring for an integrated circuit, comprising:
a first seal ring surrounding the integrated circuit;
a second seal ring spaced from the first seal ring; and
two connectors connecting the first seal ring and the second seal ring, wherein the first seal ring, the second seal ring, and the two connectors form a closed loop.

2. The double seal ring of claim 1, wherein at least one connector of the two connectors extends perpendicular to at least one of the first seal ring or the second seal ring.

3. The double seal ring of claim 1, wherein each of the first seal ring and the second seal ring comprises a plurality of metal layers and a plurality of via layers.

4. The double seal ring of claim 3, wherein each metal layer of the plurality of metal layers comprises at least one of aluminum, copper, tin, nickel, gold or silver.

5. The double seal ring of claim 3, wherein each via layer of the plurality of via layers comprises at least one of copper, copper alloy, tungsten, gold or aluminum.

6. The double seal ring of claim 1, wherein at least one of the first seal ring or the second seal ring is connected to a ground voltage.

7. The double seal ring of claim 1, wherein a distance separating the two connectors ranges from about 1 μm to about 5 μm.

8. The double seal ring of claim 1, wherein a width of the double seal ring ranges from about 10 μm to about 70 μm.

9. The double seal ring of claim 1, wherein the second seal ring is spaced from the first seal ring a distance ranging from about 1 μm to about 5 μm.

10. A method of forming a double seal ring for an integrated circuit, comprising:
forming a first seal ring surrounding the integrated circuit;
forming a second seal ring spaced from the first seal ring; and
forming two connectors connecting the first seal ring and the second seal ring, wherein the first seal ring, the second seal ring, and the two connectors form a closed loop.

11. The method of claim 10, further comprising forming the integrated circuit, wherein the first seal ring and the second seal ring are formed simultaneously with the integrated circuit.

12. The method of claim 10, wherein forming the first seal ring comprises forming a plurality of metal layers and forming a plurality of via layers.

13. The method of claim 12, wherein forming the plurality of metal layers comprises performing electroplating, physical vapor deposition (PVD) or sputtering.

14. The method of claim 13, wherein forming the plurality of metal layers further comprises performing an etching process to define a shape of each metal layer of the plurality of metal layers.

15. The method of claim 12, wherein forming the plurality of via layers comprises performing PVD or chemical vapor deposition (CVD).

16. The method of claim 15, wherein forming the plurality of via layers comprises performing a chemical mechanical planarization (CMP) process.

17. An integrated circuit with a double seal ring, the double seal ring comprising:
a first seal ring surrounding the integrated circuit;
a second seal ring spaced from the first seal ring; and
two connectors connecting the first seal ring and the second seal ring,
wherein the first seal ring, the second seal ring, and the two connectors form a closed loop and comprise electrically conductive material.

18. The integrated circuit of claim 17, wherein the first seal ring is configured to carry an electrical current in a first direction, and the second seal ring is configured to carry an electrical current in a second direction opposite to the first direction.

19. The integrated circuit of claim 17, wherein each of the two connectors comprises a plurality of metal layers and a plurality of via layers.

20. The integrated circuit of claim 19, wherein each metal layer of the plurality of metal layers comprises at least one of aluminum, copper, tin, nickel, gold or silver, and each via layer of the plurality of via layers comprises at least one of copper, copper alloy, tungsten, gold or aluminum.

* * * * *